United States Patent
Jiang et al.

(10) Patent No.: US 9,696,468 B2
(45) Date of Patent: Jul. 4, 2017

(54) METHODS FOR FABRICATING COLOR IMAGE DISPLAY DEVICES COMPRISING STRUCTURAL COLOR PIXELS FROM A GENERIC STAMP

(71) Applicant: Nanomedia Solutions Inc., Vancouver (CA)

(72) Inventors: Hao Jiang, Coquitlam (CA); Mohamad Rezaei, New Westminster (CA); Bozena Kaminska, Vancouver (CA)

(73) Assignee: NANOMEDIA SOLUTIONS INC., Vancouver (CA)

(*) Notice: Subject to any disclaimer, the term of this patent is extended or adjusted under 35 U.S.C. 154(b) by 43 days.

(21) Appl. No.: 14/951,453

(22) Filed: Nov. 24, 2015

(65) Prior Publication Data
US 2016/0146984 A1 May 26, 2016

Related U.S. Application Data

(60) Provisional application No. 62/084,245, filed on Nov. 25, 2014.

(51) Int. Cl.
| | |
|---|---|
| G02B 5/18 | (2006.01) |
| G03F 7/00 | (2006.01) |
| G02B 5/20 | (2006.01) |

(52) U.S. Cl.
CPC ......... *G02B 5/1842* (2013.01); *G02B 5/1809* (2013.01); *G02B 5/1852* (2013.01); *G02B 5/203* (2013.01); *G03F 7/0002* (2013.01)

(58) Field of Classification Search
CPC ... G03F 7/0002; G02B 5/1809; G02B 5/1842; G02B 5/1847; G02B 5/1852;
(Continued)

(56) References Cited

U.S. PATENT DOCUMENTS

| | | |
|---|---|---|
| 8,253,536 B2 | 8/2012 | Kaminska et al. |
| 2011/0250309 A1* | 10/2011 | Jeong ............ B29C 33/42 425/385 |

(Continued)

FOREIGN PATENT DOCUMENTS

WO  WO 2007/129355 A1 * 11/2007

OTHER PUBLICATIONS

Zeng et al., "Ultrathin Nanostructured Metals for Highly Transmissive Plasmonic Subtractive Color Filters," Scientific Reports, vol. 3, p. 2840, 2013.
(Continued)

*Primary Examiner* — John A McPherson
(74) *Attorney, Agent, or Firm* — Hickman Palermo Becker Bingham LLP; Malgorzata A. Kulczycka

(57) ABSTRACT

Methods for rapidly fabricating color image display for any given color image from a prefabricated generic stamp comprising arrays of structural pixels. The pixels are composed of micro-gratings and/or sub-wavelength structures that give structural colors. Different methods based on micro-patterning techniques may be used to fabricate the color image display devices, including: 1) selectively masking the generic stamp and imprinting from the masked stamp; 2) imprinting from the generic stamp and thermal-optical patterning on an imprinted layer. The fabricated color image display device can further function as a stand-alone display device or a color image stamp for replicating multiple color image display devices.

26 Claims, 9 Drawing Sheets

(58) Field of Classification Search
CPC .... G02B 5/1857; G02B 5/203; B42D 25/425; B42D 25/328; G07D 7/125
USPC .................................................. 430/320, 321
See application file for complete search history.

(56) References Cited

U.S. PATENT DOCUMENTS

| | | | |
|---|---|---|---|
| 2012/0027998 A1* | 2/2012 | Ibn-Elhaj | G02B 5/1857 428/161 |
| 2012/0152887 A1* | 6/2012 | Lee | B29C 33/3842 216/11 |
| 2015/0042702 A1 | 2/2015 | Jiang et al. | |
| 2016/0107471 A1* | 4/2016 | Landrock | B42D 25/30 359/568 |

OTHER PUBLICATIONS

Wu et al., "Angle-Insensitive Structural Colours based on Metallic Nanocavities and Coloured Pixels beyond the Diffraction Limit," Scientific Reports, vol. 3, p. 1194, 2013.
Wang et al. "Colored Image Produced with Guided-mode Resonance Filter Array," Optics Letters, vol. 36, pp. 4698-4700, 2011.
Walia et al., "Color Generation and Refractive Index Sensing Using Diffraction from 2D Silicon Nanowire Arrays," Small, vol. 10, No. 1, pp. 144-151, 2014.
Roberts et al., "Subwavelength Plasmonic Color Printing Protected for Ambient Use," Nano Letters, vol. 14, pp. 738-787, 2014.
Razaei et al. "Rapid production of structural color images with optical data storage capablities", Advanced Fabrication Technologies for Micro/Nano Optics and Photonics VIII, 9 pages, Mar. 13, 2015.
Kumar et al., "Printing Colour at the Optical Diffraction Limit," Nature Nanotechnology, vol. 7, pp. 557-561, 2012.
Hojlund-Nielsen et al., "Angle-independent Structural Colors of Silicon," Journal of Nanophotonics, vol. 8, No. 1, pp. 083988-1, 2014.
Goh et al., "Three-dimensional Plasmonic Stereoscopic Prints in Full Colour," Nature Communications, vol. 5, p. 5361, 2014.
Franklin et al., "Polarization-independent Actively Tunable Colour," Nature Communications, vol. 6, p. 7337 , 2015.
Clausen et al., "Plasmonic Metasurfaces for Coloration of Plastic Consumer Products," Nano Letters, vol. 14, pp. 4499-4504, 2014.
Chuo et al., "Rapid Fabrication of Nano-structured Quartz Stamps," Nanotechnology, vol. 24, p. 055304 , 2013.
Cheng et al., "Structural Color Printing Based on Plasmonic Metasurfaces of Perfect Light Absorption," Scientific Reports, vol. 5, p. 11045, 2015.
Chen et al., "CMOS Photodetectors Integrated With Plasmonic Color Filters," IEEE Photonic Technology Letter, vol. 24, pp. 197-199, 2012.

\* cited by examiner

METHODS FOR FABRICATING COLOR IMAGE DISPLAY DEVICES COMPRISING STRUCTURAL COLOR PIXELS FROM A GENERIC STAMP

BENEFIT CLAIM

This application claims the benefit under 35 U.S.C. 119(e) of application 62/084,245, filed Nov. 25, 2014, titled RAPID ORIGINATION OF IMAGE MASTER STAMPS AND PRODUCTION OF COLOR IMAGERIES FROM PRE-FABRICATED GENERIC STAMPS, the entire contents of which are hereby incorporated by reference for all purposes as if fully set forth herein.

FIELD

At least some example embodiments relate to methods for fabricating color image master stamps and/or color image display devices comprising structural color pixels.

BACKGROUND

Structural color pixels, including gratings and sub-wavelength structures, give out colors due to light diffraction and light-matter interactions. The structural colors display unique optical effects and have been widely used to construct color image display devices. Color image display devices made of gratings have been used in authentication and anti-counterfeit applications, for example.

For commercial applications, usually an image master stamp was first originated according to the desired image and then the image display devices were produced in a roll-to-roll process to replicate the color image display devices into large quantity from the image master stamp. At the existing systems, the image master stamps are usually produced using the 'bottom-up' methodology, i.e. specific structures giving specific color pixels are positioned at the corresponding locations of the substrate, in accordance with the color image.

Other difficulties with existing systems and techniques may be appreciated in view of the Detailed Description of Example Embodiments herein below.

SUMMARY

In some example embodiments, there is provided an apparatus which may be referred to herein as a generic stamp, including a pixel layer comprising arrays of structures as primary color pixels In an example embodiment, there is provided a generic stamp, including: a substrate layer; and a generic pixel layer supported by the substrate layer and including subpixels each defined by at least one microstructure or nano structure having at least one specific optical property including correspondence to a specific optical band or a specific color, said generic pixel layer including pixel sets, wherein the subpixels for one of the pixel sets have a same respective at least one specific optical property as the subpixels for another one of the pixel sets, wherein at least one of the microstructures or nano structures include an imprint surface.

In another example embodiment, there is provided a method for fabricating, for a target color image, a color image master stamp from a generic stamp which is generic to the target color image, the generic stamp including a pixel layer including subpixels each defined by at least one microstructure or nano structure having at least one specific optical property including correspondence to a specific optical band or a specific color. The method includes: negating at least one of the microstructures or nanostructures of the pixel layer to create a pattern of the target color image with remaining subpixels having an imprint surface.

In another example embodiment, there is provided a color image display device for displaying a target color image, including: a substrate layer; a pixel layer which is patterned with the target color image and supported by the substrate layer, and comprising structural pixels of microstructures or nanostructures having at least one specific optical property including correspondence to a specific optical band or a specific color, each of the structural pixels being of a size to tune the intensity of the optically displayed specific optical band or specific color, and the pixel layer comprising empty regions without structural pixels defined between at least some or all of the structural pixels.

In some example embodiments, the pixel layer is composed of micro-structures and/or nanostructures and/or sub-wavelength structures which give structural colors for specific optical bands. The optical bands may vary depending on the light incidence angles and/or viewing angles.

In an example embodiment, a color image display device for a given color image is fabricated from one prefabricated generic stamp using positive-tone photoresist as mask layer which is selectively patterned using contact photolithography. The generic stamp is universal for any color image, while the photomask is specific for each desired color image. The subpixels on the generic stamp are selectively transferred onto the fabricated color image display device by imprinting the masked generic stamp onto a separate substrate surface and the colors are achieved via controlling the sizes of the subpixels.

In an example embodiment, a color image display device for a given color image is fabricated from one prefabricated generic stamp using negative-tone photoresist to imprint from the generic stamp and thermal-optical patterning to selectively deactivate subpixels in the imprinted layer. The generic stamp is universal for any color image, while the photolithography exposure pattern is specific for each desired color image. The colors are achieved via controlling the sizes of the subpixels.

In an example embodiment, a color image display device for a given color image is fabricated from one prefabricated generic stamp using positive-tone photoresist as mask layer which is selectively patterned using maskless photolithography. The generic stamp is universal for any color image, while the laser exposure pattern is specific for each desired color image. The subpixels on the generic stamp are selectively transferred onto the fabricated color image display device by imprinting the masked generic stamp onto a separate substrate surface and the colors are achieved via controlling the sizes of the subpixels.

In some example embodiments, the fabricated color image display device can be used as a master stamp to replicate the color image display devices using nanoimprint lithography.

In some example embodiments, the generic stamp is composed of periodically repeated stripes of primary color subpixels. In some example embodiments, the generic stamp is composed of two dimensional periodic arrays of primary color subpixels. In some example embodiments, the generic stamp includes pixels of invisible optical band to allow additional covert information being embedded on top of the visible color image display device.

BRIEF DESCRIPTION OF THE DRAWINGS

Embodiments will now be described by way of examples with reference to the accompanying drawings, in which like reference numerals are used to indicate similar features, and in which.

DETAILED DESCRIPTION OF EXAMPLE EMBODIMENTS

Figure 1A:
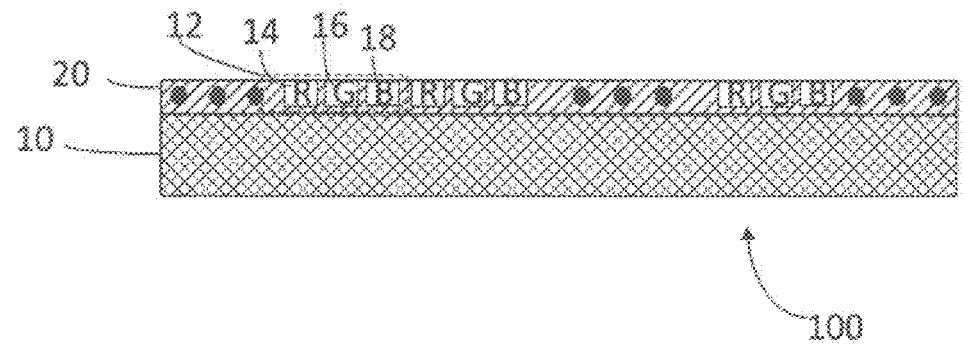
FIG. 1A shows a schematic front sectional view of the generic stamp in accordance with one example embodiment.

In an example embodiment, there is provided a generic stamp, including: a substrate layer; and a generic pixel layer supported by the substrate layer and including subpixels each defined by at least one microstructure or nano structure having at least one specific optical property including correspondence to a specific optical band or a specific color, said generic pixel layer including pixel sets, wherein the subpixels for one of the pixel sets have a same respective at least one specific optical property as the subpixels for another one of the pixel sets, wherein at least one of the microstructures or nano structures include an imprint surface.

In another example embodiment, there is provided a method for fabricating, for a target color image, a color image master stamp from a generic stamp which is generic to the target color image, the generic stamp including a pixel layer including subpixels each defined by at least one microstructure or nano structure having at least one specific optical property including correspondence to a specific optical band or a specific color. The method includes: negating at least one of the microstructures or nanostructures of the pixel layer to create a pattern of the target color image with remaining subpixels having an imprint surface.

In another example embodiment, there is provided a color image display device for displaying a target color image, including: a substrate layer; a pixel layer which is patterned with the target color image and supported by the substrate layer, and comprising structural pixels of microstructures or nanostructures having at least one specific optical property including correspondence to a specific optical band or a specific color, each of the structural pixels being of a size to tune the intensity of the optically displayed specific optical band or specific color, and the pixel layer comprising empty regions without structural pixels defined between at least some or all of the structural pixels.

At least some example embodiments relate to fabricating color image display devices. In an example embodiment, there is provided a generic stamp, including arrays of subpixels composed of micro/nano-structures that give structural colors. In some example embodiments, there are provided methods for rapidly manufacturing color image display devices and/or color image master stamps.

In at least some example embodiments, the fabricated color image display devices have functioning pixels that are raised or lowered with respect to the flat metal region.

In at least some example embodiments, reference to sub-wavelength can include a nano-structure or defined aperture, or defined pillar, or defined particle, which is smaller than the wavelength of the electromagnetic field, radiation and/or light incident upon that structure or defined aperture. Similarly, in some example embodiments, any reference to "nano" herein can be similarly modified, configured or applied to other sizes of structures, including pico or smaller, micro or larger, depending on the particular application and/or the incident electromagnetic field.

Structural color pixels, including gratings and sub-wavelength structures, give out colors due to light diffraction and light-matter interactions. The structural colors display unique optical effects and have been widely used to construct color image display devices. Color image display devices made of gratings have been used in authentication and anti-counterfeit applications, such as those demonstrated by Lai et al. (U.S. Pat. No. 7,113,690 B2, Sep. 26, 2006) and Schnieper et al. (U.S. Pat. No. 7,787,182 B2, Aug. 31, 2010; U.S. Pat. No. 8,270,050 B2, Sep. 18, 2012). A metal film having sub-wavelength apertures can be patterned into a color imagery device which can be applied towards security applications, in accordance with the teaching of Kaminska et al. (U.S. Pat. No. 8,253,536 B2, Aug. 28, 2012), having a common co-inventor as the present application. Kumar et al. (Nat. Nanotechnol. 7, 557, 2012) teaches that sub-wavelength structures comprising apertures and disks can serve as bright color pixels that allow for printing a color imagery device in a resolution comparable with optical diffraction limit.

For commercial applications, usually an image master stamp was first originated according to the desired image and then the image display devices were produced in a roll-to-roll process to replicate the color image display devices into large quantity from the image master stamp. At the existing systems, the image master stamps are usually produced using the 'bottom-up' methodology, i.e. specific structures giving specific color pixels are positioned at the corresponding locations of the substrate, in accordance with the color image. Chuo et al. (Nanotechnol. 24, 055304, 2013) teaches that one image master stamp comprised of nano-hole arrays can be originated using electron beam lithography (EBL) followed by reactive ion etching (RIE). Laser interference lithography (LIL) is another effective method to expose micro-grating patterns and to originate an image master stamp, in accordance with the teaching of Gagnon et al. (W.O. Pat. No. 2,005,053,115 A2, Jun. 9, 2005). Both EBL and LIL techniques expose the image patterns onto the substrate point by point and usually the process is lengthy and expensive. Zone-plate-array lithography (ZPAL) is a technique that can write the subregion of the image pattern in parallel with high throughput, in accordance with the teaching of Smith et al. (Microelectronic Engineering, 83, pp. 956-961, 2006). These above-mentioned popular methods to originate an image master stamp all require expensive equipment.

Although patterning structural pixels for large area is usually an expensive and lengthy process, replication of the patterned structural pixels are fairly simple and low-cost, using hot embossing and ultra-violet (UV) embossing. In addition, although the structural pixels have complex geometries in micro scale or nano scale details, the sizes of effective pixels are usually in the micro scale or submillimeter scale. Jiang et al. (W.O. Pat. No. 2,015,021,544 A1, Feb. 19, 2015), having common inventors of the present application, teaches that full color image display devices can be produced by overlaying an intensity control layer (ICL) on top of a substrate pre-patterned with periodic arrays of structural pixels, and the ICL patterns the luminance of the subpixels to produce color images with embedded covert information. The substrate is generic for any color image and the ICL is customized using micro-scale patterning technology. Such a technique allows for any color image to be produced using the structural color pixels with low cost since the same generic substrate is replicated from the same stamp.

Referring now to the drawings in detail and to FIG. 1A in particular, numeral 100 indicates a generic stamp, which is an aspect of at least some example embodiments. Generally speaking, generic stamp 100 is composed of substrate 10, pixel layer 20 and can include any additional functional layer on top of layer 20 or between layer 10 and layer 20. The material composing substrate 10 is preferably transparent for the ultra-violet (UV) spectrum, and is preferably quartz or plastic film. Pixel layer 20 is composed of arrays of primary color pixels constructed by micro/nano-structures and/or sub-wavelength structures which give structural colors. There may also be certain fiducial marks on at least one layer of the generic stamp 100, for the purpose of alignment of the generic stamp 100 with the production equipment. Layer 10 and layer 20 may also be merged into a single layer wherein the pixel layer includes the substrate by itself. In some example embodiments, the layers on the generic stamp 100 may be modified in accordance with the methods for fabricating color image display devices and color image master stamps. The generic stamp 100 has exposed micro/nano-structures and/or sub-wavelength structures which are of a depth or height and/or rigidity which provide an imprint surface, for imprinting onto a separate substrate surface.

Figure 1B:
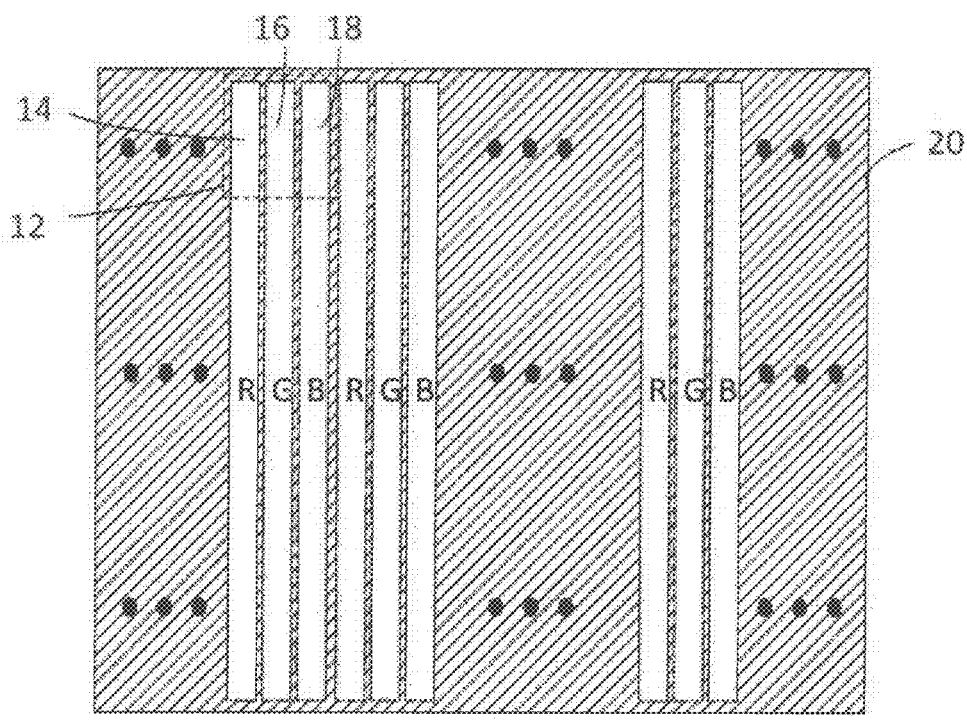
FIG. 1B shows a schematic top view of the primary color subpixels in the pixel layer.

FIG. 1B illustrates the layout of the subpixels on the pixel layer 20. Each pixel set 12 is composed of at least two types of subpixels, which are typically in a same region or proximity. For example, the pixel set 12 shown may include at least three primary color subpixels, e.g. red subpixel 14, green subpixel 16 and blue subpixel 18, following the RGB color system. The name "subpixels" can follow typically nomenclature for foundation subpixels of a color system, but subpixels can also sometimes be referred to as "pixels" in example embodiments. In at least some example embodiments, each pixel set 12 may also contain at least one type of invisible subpixel, which is used to carry covert information by giving radiation in infrared and/or ultraviolet bands. The size of each type of subpixel can range from 200 nanometers (nm) to 500 micrometers (μm) and even larger, and different types of subpixels may have the same size or different sizes (e.g. depending on fabrication capabilities, the particular application, the nature of the incident electromagnetic field, etc.). Each subpixel is constructed with micro/nano-structures and/or sub-wavelength structures. The structures can be nano-pillar arrays, nano-hole arrays, nano-particles, nano-slits, nano-cavities, nano-hole-nano-particle hybrids or a film structured with periodic topography. While the pixel set 12 in the example embodiments uses RGB color system for displaying visible colors, it may also be constructed from CMY color system with cyan, magenta and yellow subpixels. The pixel set 12 may include more than three types of subpixels, for example. In other example embodiments, the pixel set 12 can include subpixels which are colors that define a color space. The pixel set 12 may also include subpixels having at least two different other optical properties such as different angle-dependence, which may or may not have the same optical band.

In some example embodiments, the pixel set 12 comprises subpixels which are a negative impression of the desired color space. This allows the micro/nano-structures and/or sub-wavelength structures of the generic stamp 100 to be imprinted onto another substrate having a resist layer, so that the another substrate will have resulting specific colors of the color space. Therefore, for ease of reference, reference to a subpixel color such as "blue" could sometimes refer to either or both of the color of the generic stamp 100 subpixel itself being "blue" or the impression which results on the another substrate from the impression of the generic stamp 100 subpixel being "blue".

At least some of the subpixels in the pixel set 12 are of a respective proximity or distance to each other so that the effective perceivable output of the image master stamps originated from the generic stamp and/or the produced color image display devices can be perceived or viewed as a combined color of the individual subpixels. Therefore, for example, a 50% red pixel and a 50% blue pixel in a pixel set 12 are of a distance or suitably close so that the effective visual output can be viewed as violet/magenta (to a human being, or a digital or analog/film detector, for example).

While the shapes of the subpixels in some example embodiments are illustrated as being stripes extending through the entire generic stamp, other shapes are also possible, such as square, circular or triangular shapes. Within each pixel set 12, the locations of subpixels can have different configurations than the example embodiments, without deviating from the teachings of the present disclosure. The pixel set 12 and/or the subpixels can be arranged in an array, a grid, an aperiodic array, and/or a periodic arrangement.

Figure 2A:
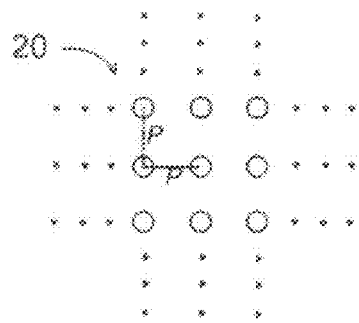
FIG. 2A shows a schematic top view of one nanostructure array structure for one subpixel in the pixel layer of the generic stamp.
Figure 2B:
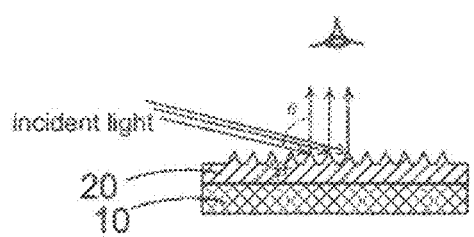
FIG. 2B shows a front sectional view of one nanostructure array and the grating effects to display structural colors in $1^{st}$ reflection grating order.

In some example embodiments, the subpixels are constructed by two-dimensional (2-D) nanostructure arrays. FIG. 2A shows a schematic top view of a nanostructure array, wherein the 2-D nanostructure array has sub-wavelength pillars (nano-pillars) arranged in square lattice periodic array. The center-to-center spacing between the neighboring pillars is given by P. In each nanostructure array structure the interference of light wave causes angle-dependent light diffraction, giving specific reflection color and/or transmission color. As shown in FIG. 2B, white light (polychromatic light) is incident at an angle θ relative to the direction perpendicular to the nanostructure array surface. The nanostructure arrays reflects the $m^{th}$ grating order into the direction perpendicular to the substrate surface for light of wavelength λ. The relation that links P with λ is given by Equation (1):

$$P \sin \theta = m\lambda \quad (1)$$

In the example embodiments, white light is incident at 80° (i.e., θ=80°)and the red, green, blue subpixels reflects light with λ equal to 630 nm, 540 nm, and 450 nm, respectively. The $1^{st}$ reflection grating order is chosen, i.e. (m=1), in order to obtain relatively solid colors and to minimize the rainbow effects that exist in many commercial holograms.

Figure 2C:
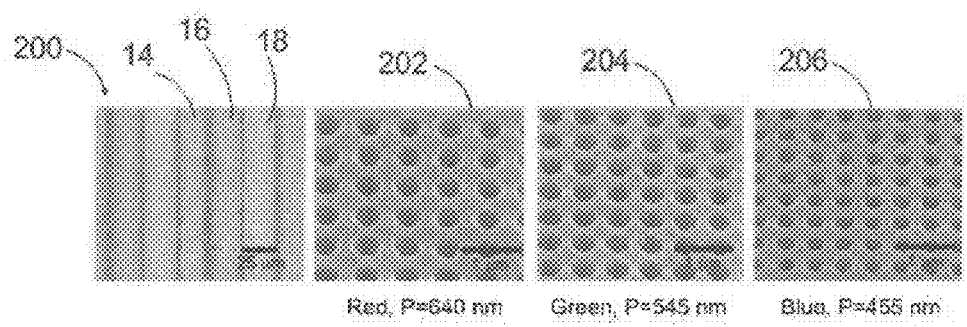
FIG. 2C shows scanning electron microscope images of the generic stamp comprising nano-hole arrays for imprinting red, green and blue subpixels.

FIG. 2C shows the scanning electron microscope (SEM) images at 45° angle of the pixel layer of one example embodiment. A 20 nm thick Ni layer was deposited on the surface using sputtering deposition to make the surface conductive for SEM imaging. The pixel layer 20 is composed of subpixels configured with the following geometrical parameters: red subpixel 14 (P=640 nm, image 202), green subpixel 16 (P=545 nm, image 204) and blue subpixel 18 (P=455 nm, image 206). The nano-holes are in the conical shape with wider bases and sharper tips. The generic stamp is fabricated using laser interference lithography and reactive ion etching. An aluminum film (100 nm thick) was first coated on the quartz substrate and laser interference lithography and reactive ion etching was implemented to pattern nanohole arrays into the aluminum film. Then the patterned aluminum film was used as etching mask in reactive ion etching to transfer the pattern into the quartz surface. The etching condition was finely tuned to adjust the taper angle of the side walls of the holes.

Figure 2D:
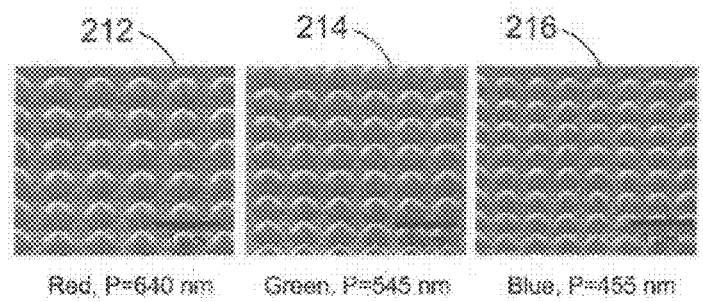
FIG. 2D shows scanning electron microscope images of the nano-pillar arrays that are imprinted from the generic stamp.

FIG. 2D shows the nano-pillar array gratings that can be directly imprinted from the pixel layer. Image 212 shows the structures imprinted from the subpixel shown in image 202. Image 214 shows the structures imprinted from the subpixel shown in image 204. Image 216 shows the structures imprinted from the subpixel shown in image 206.

Figure 3A:
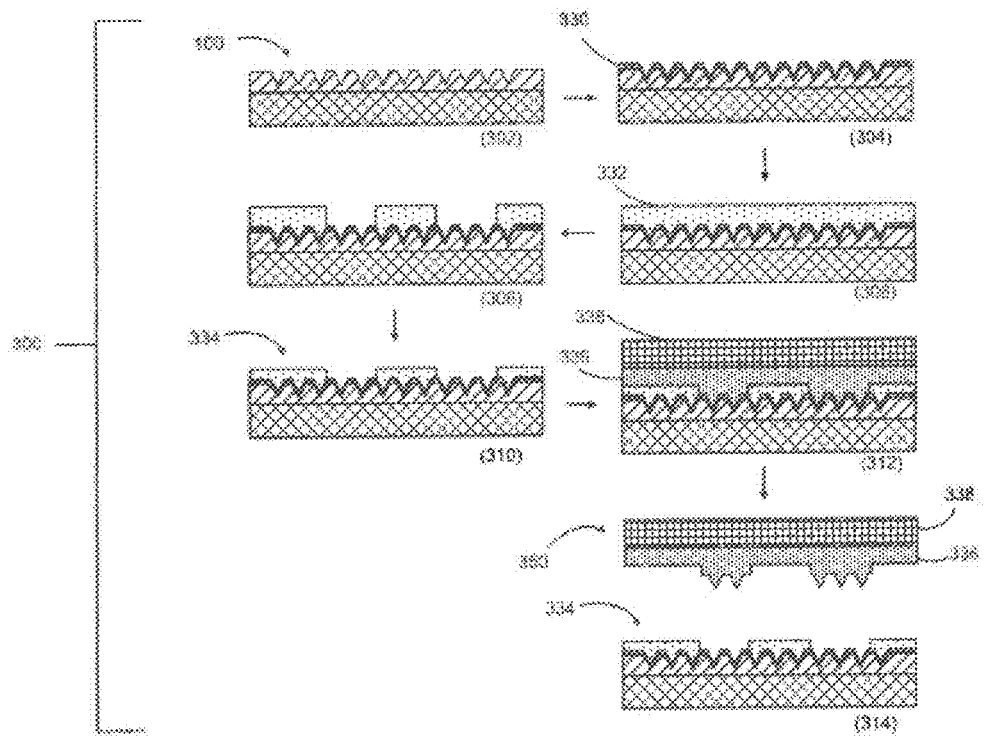
FIG. 3A shows a schematic of a method for fabricating color image display devices by selectively masking the generic stamp and imprinting from the masked stamp.

FIG. 3A shows a schematic of method 300 to fabricate color image display devices or image master stamps for any given color image from the generic stamp 100 (nano-hole array patterns on top of a quartz substrate). At event 302, there is provided the generic stamp 100 which is cleaned with organic solvents. At event 304, a thin layer 330 is deposited on the surface of the generic stamp 100 and the layer 330 is in direct contact with the pixel layer. The thickness of layer 330 ranges from 10 nm to 50 nm and is typically 20 nm. The purpose of the layer 330 is to enhance the refractive index contrast for assisting alignment procedures in later steps. At event 306, a mask layer 332 is coated on top of the layer 330. The mask layer 332 covers all the subpixels in the pixel layer 20. The mask layer 332 is composed of a material that can be patterned with micro-scale apertures and its thickness ranges from 100 nm to 20 micrometers and is typically 1 micrometer. At event 308, the mask layer 332 is patterned with micro-patterning technique such as photolithography to make apertures through the film to allow access to the subpixels underneath. There can be one or multiple apertures on top of each subpixel and the sizes of the apertures are determined by the color image. For example, given a pixel of the color image in RGB color space defined by 50% red, 10% green and 50% blue, on the corresponding location of the color image display device, the aperture sizes on the red, green and blue subpixels should occupy 50%, 10% and 50% of the subpixel area respectively. At event 310, the thickness of the mask layer is reduced, typically by an oxygen plasma etching process, and a masked stamp 334 is obtained. The reduced thickness helps to improve the image quality of the fabricated color image display device. In some alternate example embodiments, event 310 is not required. At event 312, the masked stamp 334 is used a stamp to imprint onto a separate substrate 338 using nanoimprint resist layer 336. Typically, UV nanoimprint is used because of the high fidelity in the yielded structures. UV-curable polymer is used as the nanoimprint resist layer 336 and transparent plastic sheet is used as the substrate 338. UV polymer is casted on top of the masked stamp 334 and a plastic sheet 338 is pressed against the stamp as a high pressure. After sufficient amount of time of applying pressure, UV polymer is cured with a flood UV exposure. At event 314, a color image display device 350 comprising substrate 338 and imprinted structural color pixels is delaminated from the masked stamp 334.

Figure 3B:
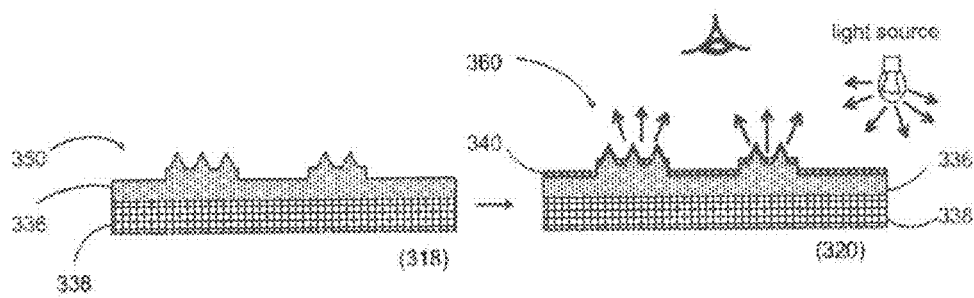
FIG. 3B shows a schematic of a color image display device coated with a thin film for enhancing the brightness of the displayed color image wherein the functioning pixels are raised with respect to the flat metal regions.
Figure 3C:
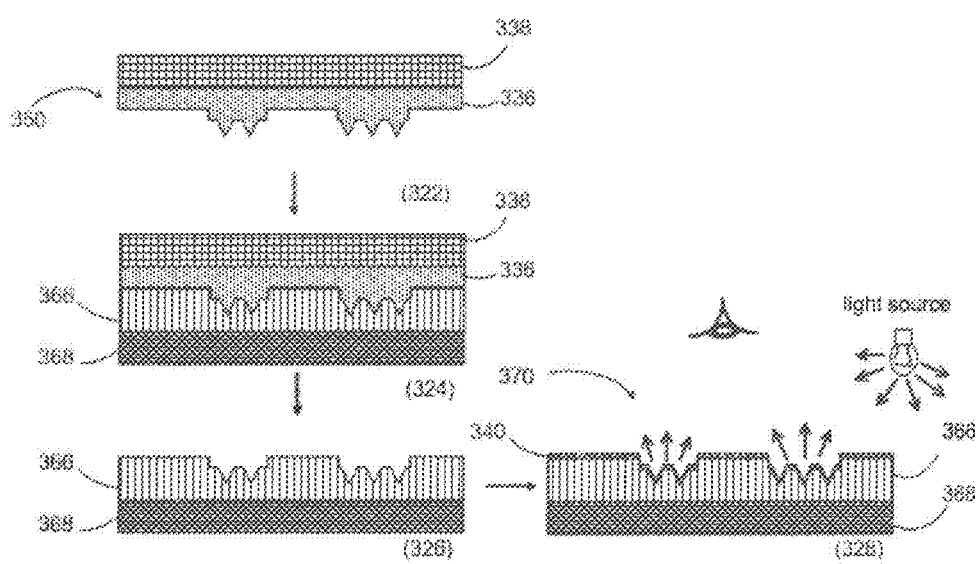
FIG. 3C shows a schematic of a process for using a fabricated color image display device as a stamp to imprint multiple color image display devices wherein the functioning pixels are lowered with respect to the flat metal regions.

The color image display device 350 can be used as a stand-alone device or a color image master stamp to replicate multiple color image display devices. FIG. 3B shows a schematic of using the color image display device 350 by coating an additional layer 340 to enhance the brightness of the structural pixels. The material composing layer 340 is preferably metal such as aluminum or dielectric material with high refractive index such as zinc oxide. Under the lighting condition as designed, the displayed color image can be viewed from the direction perpendicular to the device surface. Owing to the height introduced by the mask layer 332, the functioning pixels are raised with respect to the flat regions which appear dark under diffraction mode. FIG. 3C shows a schematic of a process for replicating multiple color image display devices using the fabricated color image display device 350 as a color image master stamp. At event 322, there is provided the master stamp 350 which is fabricated using the method 300. The surface of the master stamp 350 is coated with an anti-adhesive layer to assist separation between the stamp and the imprinted layer. At event 324, the stamp 350 is imprinted into a nanoimprint resist layer 366 on top of substrate 368. Either UV nanoimprint or thermal nanoimprint can be used and with the correct imprint resist in layer 366. At event 326, the stamp 350 is separated from the imprinted layer with the patterns in the resist layer. At event 328, the imprinted layer is coated with a thin layer 340 to enhance the brightness of the structural pixels and a color image display device 370 is obtained which is replicated from the color image master stamp 350. The material composing layer 340 is preferably metal such as aluminum or dielectric material with high refractive index such as zinc oxide. Under the lighting condition as designed, the displayed color image can be viewed from the direction perpendicular to the device surface. Owing to the height introduced by the mask layer 332, the functioning pixels are lowered with respect to the flat regions that appear dark under diffraction mode. As shown, in some example embodiments the flat regions are located between each and every of the pixels. In other example embodiments, the flat regions are located between some of the pixels.

Figure 4A:
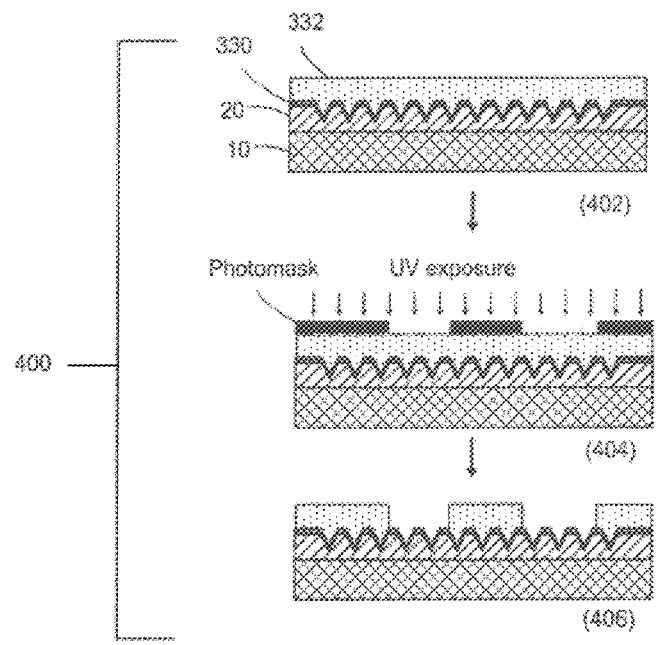
FIG. 4A shows a schematic of a process for selectively patterning the mask layer by means of contact photolithography.
Figure 4B:
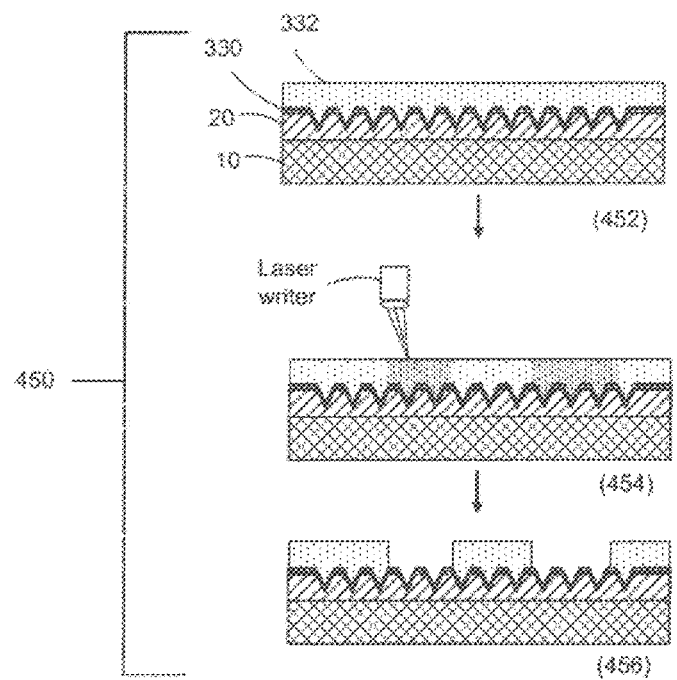
FIG. 4B shows a schematic of a process for selectively patterning the mask layer by means of maskless photolithography.

In the method 300, an important step is 308 to make apertures inside the mask layer. Typically, patterning the apertures on top of each subpixel requires micrometer accuracy and photolithography is implemented. FIG. 4A and FIG. 4B show two different photolithography process, process 400 based on contact photolithography and process 450 based on maskless photolithography. In process 400, at event 402, there is provided the generic stamp coated with a mask layer 332 composed of positive-tone photoresist. At event 404, a binary chrome mask created in accordance with the target color image is used as the photomask for contact photolithography onto the generic stamp coated with the mask layer. The photomask is aligned with the subpixels in the generic stamp to expose the mask layer 332 on each subpixel with a pattern of aperture in appropriate size. At event 406, the exposed mask layer 332 is developed and the open apertures are obtained to allow access to the subpixels underneath.

In process 450, at event 452, there is provided the generic stamp coated with a mask layer 332 composed of positive-tone photoresist. At event 454, maskless photolithography using a laser writer is used to expose a binary pattern onto the mask layer 332. The exposure pattern is aligned with the subpixels in the generic stamp to expose the mask layer 332 on each subpixel with a pattern of apertures in appropriate sizes. At event 456, the exposed mask layer 332 is developed and the open apertures are obtained to allow access to the subpixels underneath.

Figure 5:
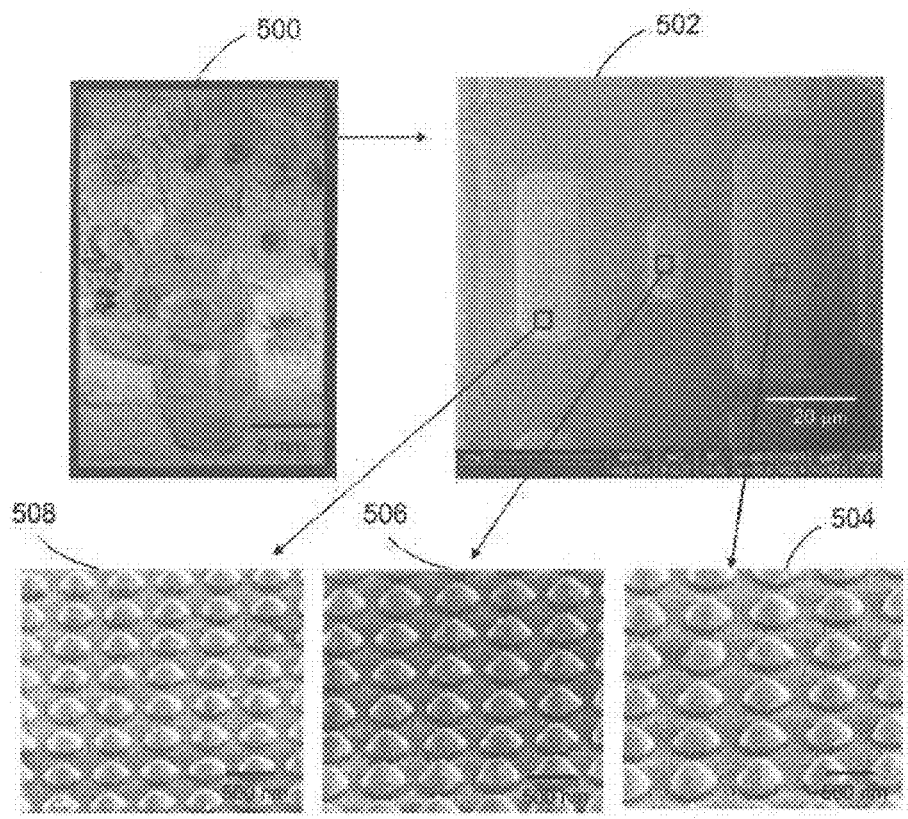
FIG. 5 shows experimental results of one color image display device fabricated using positive-tone photoresist as mask layer and contact photolithography to pattern the mask layer.

FIG. 5 shows the experimental results of a color image display device (or color image master stamp) fabricated using method 300. Image 500 is a photo of the fabricated color image display device captured using a digital SLR camera (Canon 50D) and a 50 mm lens (F/2.5) with light incident from 80° angle (shown here in grayscale). The size of the color image display device is 15 mm×20 mm. Image 502 is a 0° SEM image of the region at the tip of one of the flowers in the photo. Image 504, 506 and 508 are the zoom-in SEM images at 45° to resolve the details of the red, green and blue subpixels respectively. A thin layer of gold was sputtered onto the device surface to make the device conductive for SEM imaging. For fabricating this device, positive-tone photoresist film (1.3 µm thick) was used as the mask layer and contact photolithography was used to pattern the mask layer using a binary chrome photomask fabricated in accordance with the target color image. A UV polymer was used in the UV nanoimprint lithography to imprint the masked stamp onto the surface of a plastic sheet. The size of one subpixel in the generic stamp is 25 µm×75 µm and each pixel set is therefore in the size of 75 µm×75 µm. The fabricated device features a resolution of 339 pixels per inch (PPI). In the region of interest for the SEM imaging, the sizes of the imprinted red, green and blue subpixels are configured to produce a pink/yellow color. Any visual color can be obtained by properly adjusting the sizes of the red, green and blue subpixels in each pixel set and the sizes are controlled by assigning a correct size on the aperture corresponding to each subpixel in the binary photomask pattern.

Figure 6:
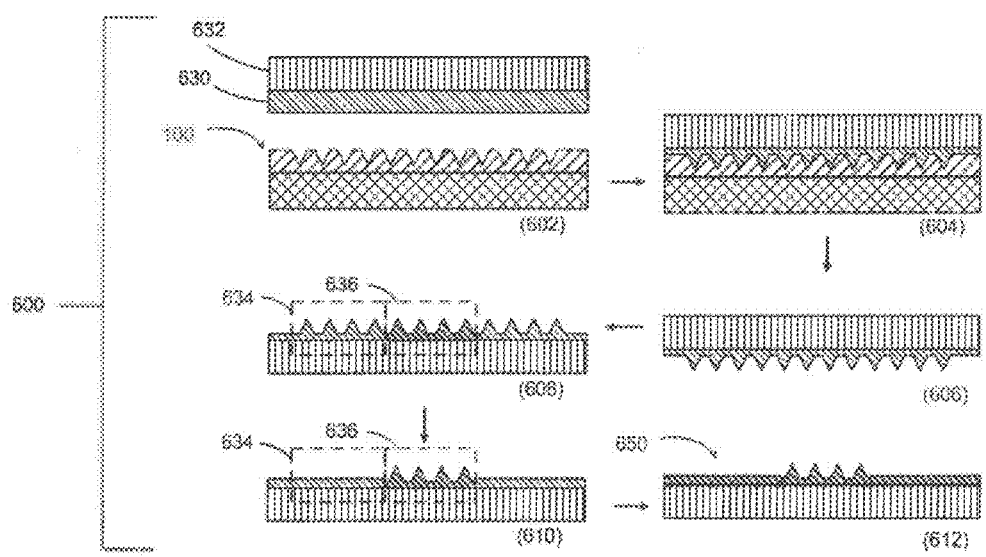
FIG. 6 shows a schematic of a method for fabricating color image display devices by imprinting from the generic stamp and thermal-optical patterning of the imprinted layer.

Reference is now made to FIG. 6, which shows a schematic of method 600 for fabricating a color image master stamp or color image display device for a given color image from the generic stamp 100. At event 602, there is provided the generic stamp 100 with the surface treated with anti-adhesive layer and a resist layer 630 coated on substrate 632. The material composing the resist layer 630 should be a material that can be thermally imprinted and its thermal property (typically glass transition temperature) can be selectively patterned with micro-scale resolution. The material is preferably a photosensitive polymer that can be patterned using UV exposure. Once exposed with UV and thermally cured, the material's glass transition temperature increases sufficiently. At event 604, the generic stamp 100 is imprinted into the resist layer 630 using thermal nanoimprint lithography. At event 606, the generic stamp 100 is separated from the resist layer 630 and the nano-pillar array structures remain on the surface of resist layer 630. At this point, the resist layer 630 may itself be used as a generic stamp, with suitable post-processing. At event 608, the resist layer 630 is selectively patterned using micro-patterning technique. For example, photolithography can be implemented to expose region 636 while other regions, such as region 634, are unchanged. After patterning, materials in region 636 and 634 have different glass transition temperature. At event 610, the sample is baked at a temperature between the two different glass transition temperatures (between region 636 and 634). Since the baking temperature is higher than the glass transition temperature in region 634, the nano-pillars are melted into a flat film. Because the baking temperature is lower than the glass transition temperature in region 636, the nano-pillar array structures are barely changed during the baking. At event 612, the resist layer 630 is fixed and a color image display device 650 is obtained. The resist layer 630 can be fixed by applying the same processing condition that is used in step 608 over the entire layer. For example, a flood UV exposure followed by baking can completely fix the entire resist layer 630 and the result is a layer of high glass transition temperature with selectively patterned nano-pillar arrays as pixels. At this point, the resist layer 630 may also be used as a master stamp for other impressions, as it has suitable rigidity and an exposed impression surface.

Figure 7:
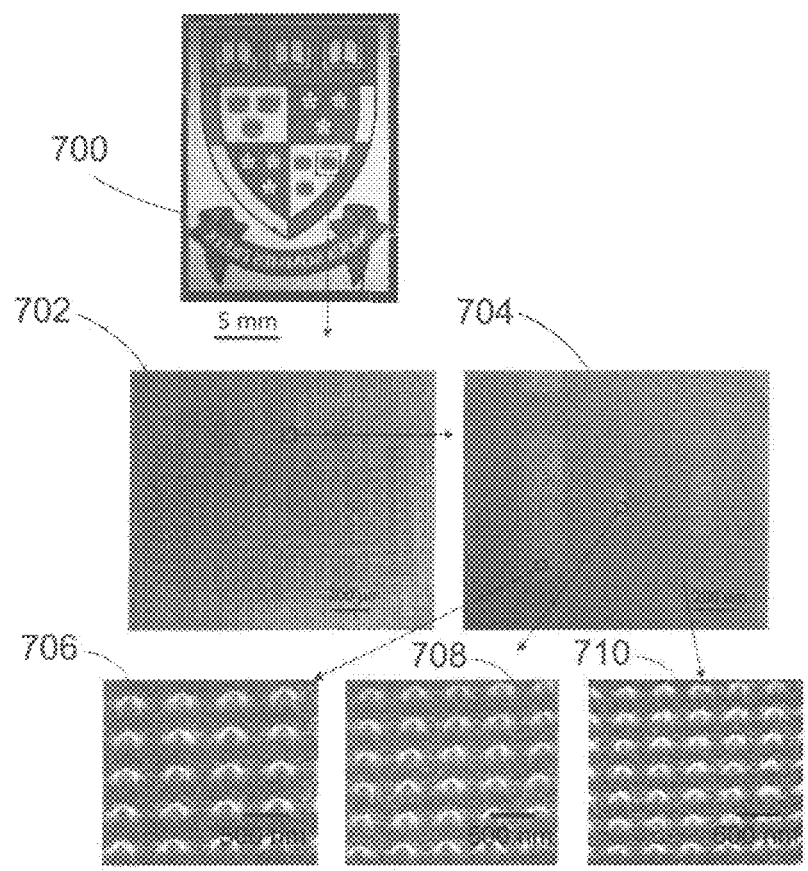
FIG. 7 shows experimental results of one color image display device fabricated using negative-tone photoresist and thermal-optical patterning.

FIG. 7 shows the experimental results of a color image display device (or color image master stamp) fabricated using method 600. Image 700 is a photo of the fabricated color image display device captured using a digital SLR camera (Canon 50D) and a 50 mm lens (F/2.5) with light incident from 80° angle (shown here in grayscale). The size of the color image display device is 15 mm×20 mm. Image 702 is a 45° SEM image of the region at the red crown of the logo in the photo. Image 704 is a zoom-in SEM image (at angle of 45°) to illustrate the sizes of the subpixels to produce a red color. Image 706, 708 and 710 are the zoom-in details of the red, green and blue subpixels respectively. A 50 nm thick aluminum film was evaporated onto the device surface to make the device conductive for SEM imaging. The size of one subpixel in the generic stamp is 25 µm×75 µm and each pixel set is therefore 75 µm×75 µm. The fabricated device features a resolution of 339 PPI. In the region of interest for the SEM imaging, the sizes of the imprinted red, green and blue subpixels are configured to produce a red/pink color. Any visual color can be obtained by properly adjusting the sizes of the red, green and blue subpixels in each pixel set and the sizes are controlled by assigning a correct size on the aperture corresponding to each subpixel in the binary photomask pattern. For fabricating this device using method 600, a photosensitive polymer film was used as the resist layer 630 and a 250 μm thick plastic sheet was used as the substrate layer 632. Upon exposure and thermal curing, the glass transition temperature of the material comprising the resist layer 630 can be increased by more than 100° C.

Figure 8A:
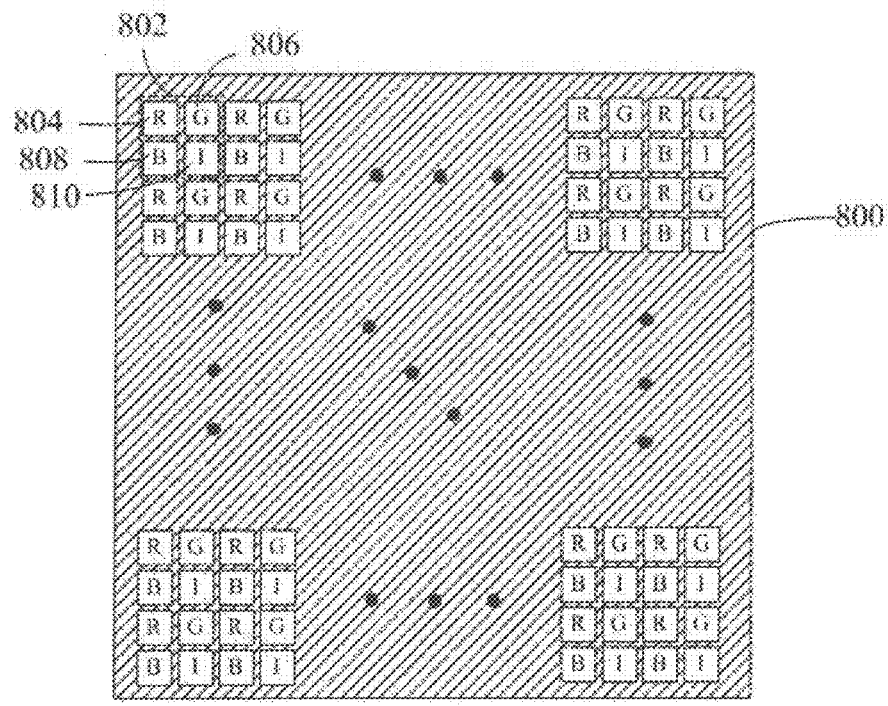
FIG. 8A shows a schematic top view of primary color subpixels in the pixel layer of a generic stamp comprising red, green, blue and infrared subpixels.

Although in the above-described example embodiments, 1-D arrays of subpixel stripes are used in the generic stamp, the presented methods can also be generalized and applied to a generic stamp comprising 2-D array of subpixels. Reference is now made to FIG. 8A which shows a schematic top view of the generic stamp 800. Each pixel set 802 comprises at least two types of subpixels, which are typically in a same region or proximity. For example, the pixel set 802 may include at least three primary color subpixels, red subpixel 804, green subpixel 806, blue subpixel 808 and one additional infrared subpixel 810. The red (R), green (G) and blue (B) subpixels are used to display visible color images and the infrared (I) subpixel is used to embed covert information (machine readable) into the color image display device.

Figure 8B:
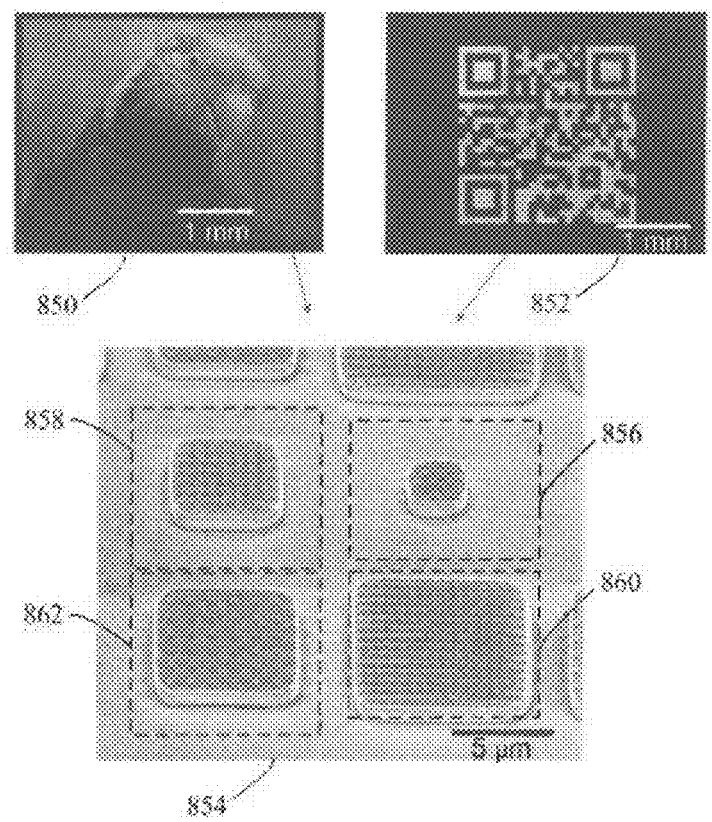
FIG. 8B shows experimental results of one color image display device fabricated from the generic stamp.

FIG. 8B shows experimental results of a color image display device fabricated from the generic stamp 800 using method 300. Maskless photolithography using a laser writer is used to expose and pattern the mask layer composed of a positive-tone photoresist. Image 850 is a photo of the fabricated color image display device captured with a color camera (shown here in grayscale). Image 852 is a gray-scale pattern captured using an infrared image reader sensitive to the spectrum 800 nm~1000 nm. The color image and the infrared pattern are displayed in the same surface in the fabricated color image display device. The size of the device is 4 mm×3 mm. Each subpixel size is 10 μm×10 μm and therefore each pixel set is 20 μm×20 μm in size, equivalent to 1,270 PPI resolution. Image 854 is a 45° SEM image of a region indicated by the arrow from the fabricated color image display device. On the SEM image, region 856, 858, 860 and 862 is for the red, green, blue and infrared subpixels in the region of interest. Given the sizes of the subpixels, the pixel set displays a cyan color in visible spectrum and a bright spot in the infrared spectrum. The periods for red, green, blue and infrared subpixels are 727 nm, 612 nm, 542 nm and 981 nm, respectively. The nano-pillars have an average wide base diameter about 420 nm, height around 450 nm and cone taper angle around 45°. As can be seen in FIG. 8B, the subpixels in regions 856, 858, 860 and 862 are raised with respect to surrounding empty regions between all of the regions as a consequence of imprint from the mask layer. In some example embodiments, the regions 856, 858, 860 and 862 are raised from the empty regions to a height which can range from e.g. greater than 0 nm to 100 micrometers. In other example embodiments, the surrounding empty regions are between only some of the regions. The regions 856, 858, 860 and 862 are of different transverse sizes or widths which are designed to tune the displayed intensity of that specified color. In other example embodiments, the functioning pixels can be lowered against the empty regions, such as in the original masked stamp 334 (FIG. 3A).

Figure 9:
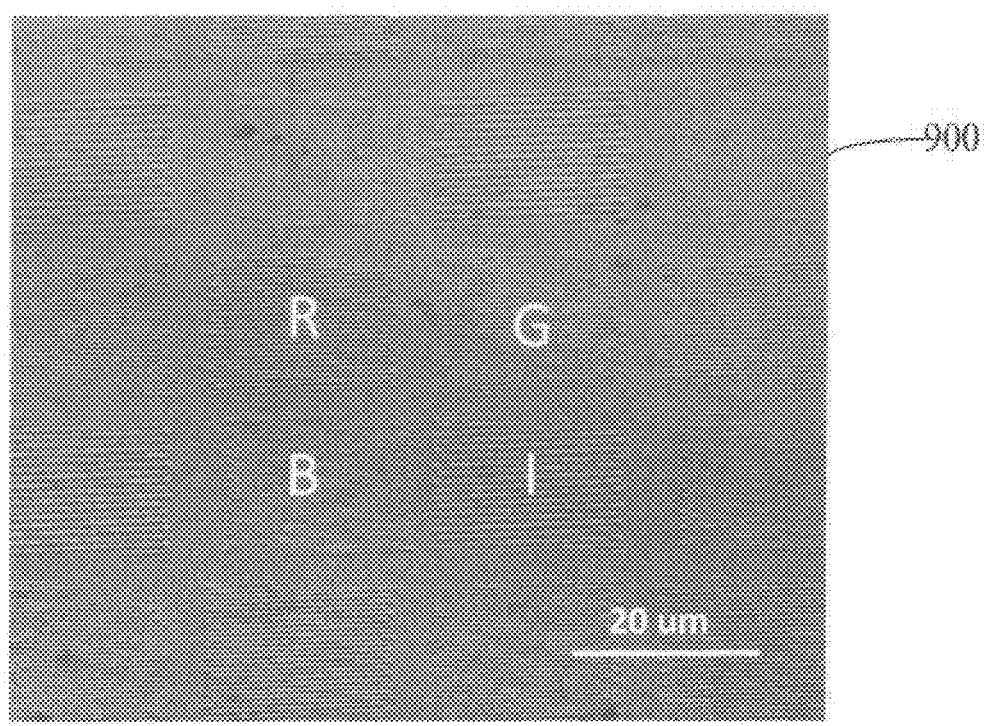
FIG. 9 shows a schematic top view of the pixel layer of a generic stamp comprising 1-D gratings.

Reference is now made to FIG. 9 which shows an 30° SEM image of the fabricated generic stamp 900 with the layout given in FIG. 8A. The subpixels are constructed with 1-D micro-gratings. The grating periodicities for the red, green, blue and infrared subpixels are 879 nm, 728 nm, 591 nm and 1160 nm, respectively. When polychromatic light is incident from 45° angle, the micro-gratings reflect the 1$^{st}$ order of the corresponding color into the direction perpendicular to the sample surface. The infrared subpixel reflects light centered at 820 nm in wavelength into the same said grating order. The size of the subpixel is 25 μm×25 μm and thus one effective pixel is 50 μm×50 μm, equivalent to 508 PPI resolution.

It should be noted that the colors displayed by the subpixels depend on the light incident angle and the viewing angle, due to the grating nature. In our experiments (not shown here), color-shifting effects can be clearly observed from the samples shown in FIG. 5, FIG. 7 and FIG. 8, by tilting the light incident angle and/or viewing angle.

In some example embodiments, nano-pillar arrays, nano-hole arrays and 1-D micro-gratings were used as structural subpixels for primary colors and/or infrared subpixels in the generic stamp. It should be noted that, the presented methods were not limited to the generic stamps using the presented structures in example embodiments. Other structures that can give structural colors can also be used to construct structural pixels, such as nano-cavities, nano-particles and nano-particle-nano-cavity hybrid structures. Angle-insensitive pixels from nano-cavities, in accordance with the teaching of Wu et al. (Sci. Rep. 3, 1194, 2013), can also be used to construct the generic stamp.

Figure 10:
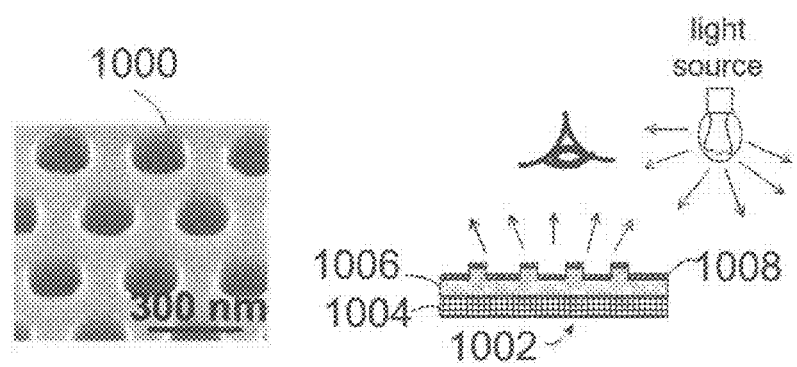
FIG. 10 shows a scanning electron microscope image of sub-wavelength nano-hole array in the pixel layer of a generic stamp and a schematic of a plasmonic color pixel displaying colors via surface plasmons fabricated from the nano-hole array.

Reference is now made to FIG. 10, which shows one type of sub-wavelength structures in the pixel layer of a generic stamp from which sub-wavelength plasmonic pixels can be imprinted. It should be noted that, in the plasmonic pixels, metal film is required on top of the sub-wavelength structures and the colors are caused by the imprinted sub-wavelength structures and the deposited metal film together. Image 1000 is a 45° SEM image of a 2-D nano-hole array. Image 1002 schematically shows the structural colors displayed by the plasmonic pixel. Layer 1004 is a substrate. Layer 1006 is imprinted by the structure shown in image 1000 and has sub-wavelength nano-pillars. Layer 1008 is a thin film of metal and is preferably silver or aluminum. The structure shown in image 1002 is essentially a nano-disk array onto a nano-hole array. In accordance with the teaching of Clausen et al. (Nano Letters, 14, 4499, 2014), various structural colors can be achieved by adjusting the diameters and periods of the aluminum nano-disks or nano-holes. For visible colors, the period is usually between 100 nm and 400 nm and the diameter of the nano-disk or nano-hole is usually between 30 nm and 350 nm. It should be noted that the structural colors displayed by the structure shown in image 1002 is angle-robust which shift slightly with varying angle and the colors are usually viewed in reflection mode.

It should be appreciated that, in fabricating color image display devices using method 300 and 600, the generic stamp is universal for any color image display device while the colors are actually determined by the photomask pattern or the laser exposure pattern. The resolution, image size, structural pixel properties such as brightness, color purity and angle-dependence, are all determined by the generic stamp.

Color image master stamp 350 or 650 can also be used to replicate the color images in large quantity. In our experiments (not shown here), a copy of the image master stamp 350 was directly mounted into a roll-to-roll UV embossing machine to imprint the color image display devices on to a roll of thin plastic film. The imprinted pattern showed high fidelity over 1,500 feet of the roll.

It may be appreciated that on the image stamp originated using method 300, the effective transferred subpixels are elevated by a height compared to the surrounding empty region and the said height is controlled by the mask layer thickness and the oxygen plasma process together. Such a characteristic provides distinctions compared to color image display devices comprising structural color pixels fabricated using conventional lithography methods.

It should be noted that for bright visual effects, metal thin layer, preferably aluminum or silver, and/or dielectric layer with high refractive index, preferably zinc oxide or zinc sulfide, can be coated on the surface of the color image display devices fabricated in example embodiments.

It may be appreciated that, using the methods presented in example embodiments, the cost of the master stamp origination is significantly reduced from using expensive nano-patterning equipment into a level comparable with a conventional photolithography. The process is much faster than conventional methods based on electron beam lithography. For example, to fabricate a color image display device of 4 mm×3 mm size, it takes about 15 minutes for the laser writer to expose the mask layer in the example embodiments; however, it would take at least 2 hours if the same image is patterned with electron beam lithography. In addition, the cost and time in electron beam lithography increases drastically with increasing image size. In the methods disclosed in this invention, if contact lithography is implemented, the cost is reduced to the same level as implementing a single photolithography.

Although optical patterning are favorably used in above-described embodiments to produce color image display devices or image master stamps, other micro-scale patterning methods can also be used, such as negating the structural pixels or imprint surface using mechanical machining, chemical etching or material deposition.

It may be appreciated that, in some example embodiments, the fabricated color image display devices and color image master stamp are customized primarily or solely by the photomask or laser exposure pattern while the generic stamp is truly generic to all color images. In other words, devices of different color images can be fabricated from the same generic stamp. A stock of different generic stamps can be pre-fabricated using low-cost laser interference lithography and the target color image can then be customized by patterning primarily the photomask. Different pixel densities, pixel resolutions, pixel layouts, shapes, angle-dependence, color schemes, etc. may be generated and selected based on the particular application or budget.

In some example embodiments, the size of the generic stamp may range from a few millimeters to a few meters. Principally, the size of the generic stamp is only restricted by the fabrication technique. To fabricate a color image display device and/or color image master stamp from the generic stamp, the apparatus may include components to allow each subsection of the photoresist layer being exposed serially or in parallel.

In some example embodiments, a tangible optical storage medium for information storage and information communication can be fabricated using the presented methods. The tangible optical storage medium can encode information as color patterns, black/white patterns, covert patterns, and/or binary data, produced onto the color image display devices. By way of non-limiting example, the pattern can include an image, 1-D barcode, 2-D barcode, QR barcode, color barcode, High Capacity Color Barcode (HCCB) developed by Microsoft (™) and defining triangular clusters of pixels, or any combination or sub-combination thereof, etc. A color barcode system can be produced, wherein the color or invisible radiation of a pixel or a group of pixels can be used to store information, typically at least binary information. In addition, a change in viewing angle can result in a different pattern and associated information being communicated, in some example embodiments. The information can be communicated and be read by a recipient or a reader, for example. The embedded information can be read by human eyes and/or by an imaging device which may be a stand-alone device or a component attached to a mobile device. Note that conventional printed barcodes can be subject to fading, inconsistencies, readily unscrupulously copied, etc.

In some example embodiments, the produced color image display devices may only be able to be correctly viewed from a certain angle and may require specific illumination conditions and/or assisting devices. Such a feature may be ideal for security applications, and may not be easily unscrupulously copied. The fabricated color image display devices in at least some of the described example embodiments can be used for security applications including optical document security labels and identity photos. In some example embodiments, the security document can be provided in the form of a thin flexible sheet, such as banknotes, passports, certificates, identification documents, financial documents, authentication certificates, and other value papers, for example. The security document can include a document substrate forming the backbone of the security document, and in which other components of the security document may be embedded and/or on which other components may be attached or printed, for example. In other example embodiments, the security document can be in the form of a rigid sheet or apparatus, for example for identification or security cards, tags, badges, etc.

In some example embodiments, the generic stamps may be simplified for producing images with simple colors. For example, a generic stamp may contain only red and green primary color subpixels and can be used to produce color image display devices that only contain colors presentable by mixture of red and green colors.

The produced color image display devices described in at least some of the example embodiments may be used for artistic purposes including clothing material, advertisements and decorative pictures.

The produced color image display devices described in at least some of the example embodiments may be used for safety applications, such as traffic signs and warning signs, which will enhance the scattered light intensity to make the signs more obvious to human eyes.

In some example embodiments, reference to layer may not necessarily mean a 2-D plane, but in some example embodiments may be layered onto other types of surfaces, such as a curved surface, or a patterned surface such as ridges, waves, etc., or in or around a 3-D D object, etc. Reference to layer can also include a 1-D pattern, for example on a thin thread or a thin fiber.

Certain adaptations and modifications of the described embodiments can be made. Therefore, the above discussed embodiments are considered to be illustrative and not restrictive. Example embodiments described as methods would similarly apply to systems, and vice-versa.

Variations may be made to some example embodiments, which may include combinations and sub-combinations of any of the above. The various embodiments presented above are merely examples and are in no way meant to limit the scope of this disclosure. Variations of the innovations described herein will be apparent to persons of ordinary skill in the art, such variations being within the intended scope of the present disclosure. In particular, features from one or more of the above-described embodiments may be selected to create alternative embodiments comprised of a sub-combination of features which may not be explicitly described above. In addition, features from one or more of the above-described embodiments may be selected and combined to create alternative embodiments comprised of a combination of features which may not be explicitly described above. Features suitable for such combinations and sub-combinations would be readily apparent to persons skilled in the art upon review of the present disclosure as a whole. The subject matter described herein intends to cover and embrace all suitable changes in technology.

What is claimed is:

1. A method for fabricating, for a target color image, a color image master stamp from a generic stamp which is generic to the target color image, the generic stamp including a pixel layer including subpixels each defined by at least one microstructure or nanostructure having at least one specific optical property including correspondence to a specific optical band or a specific color, the method comprising:
   negating at least one of the microstructures or nanostructures of the pixel layer to create a pattern of the target color image with remaining subpixels having an imprint surface.

2. The method as claimed in claim 1, wherein the remaining subpixels comprise at least partial remaining subpixels in a pattern of the target color image.

3. The method as claimed in claim 1, wherein the pattern of the target color image is solely customized by said negating.

4. The method as claimed in claim 1, wherein said negating further comprises:
   covering the pixel layer of the generic stamp with a mask layer to block all subpixels;
   making selective apertures into said mask layer to access individual said subpixels to obtain a masked stamp of the pattern of the target color image, wherein a size of each aperture is dependent on an amount of the specific optical band or the specific color for the individual subpixel corresponding to the target color image.

5. The method as claimed in claim 4, further comprising:
   reducing a thickness of said mask layer after said making selective apertures.

6. The method as claimed in claim 4, further comprising imprinting the masked stamp onto a separate resist surface.

7. The method as claimed in claim 6, wherein the imprinted separate resist surface includes subpixels which are raised with respect to surrounding empty regions as a consequence of imprint from the mask layer.

8. The method as claimed in claim 6, wherein the separate resist surface is useable as a second color image master stamp.

9. The method as claimed in claim 4, wherein said making selective apertures into said mask layer includes performing photoresist which is patterned by ultra-violet radiation.

10. The method as claimed in claim 4, wherein said making selective apertures into said mask layer includes performing photolithography.

11. The method as claimed in claim 10, wherein said photolithography includes contact photolithography or maskless photolithography.

12. The method as claimed in claim 4, wherein said making selective apertures into said mask layer includes using laser exposure.

13. The method as claimed in claim 4, wherein the pattern of the target color image is solely customized by said mask layer.

14. The method as claimed in claim 1, wherein a size of the remaining subpixels is dependent on an amount of the specific optical band or the specific color for the subpixel of the target color image.

15. The method as claimed in claim 1, wherein the pixel layer includes a resist layer which is imprinted from a second generic stamp.

16. The method as claimed in claim 1, wherein the pixel layer is composed of material which has thermal property that can be selectively modified, wherein said negating further comprises:
   exposing the pixel layer with ultra-violet radiation to selectively increase the glass transition temperature of the material on certain individual subpixels;
   baking at a temperature that is higher than a glass transition temperature of the unexposed pixel layer and lower than the glass transition temperature of the exposed pixel layer to melt the unexposed pixel layer into a flat film, wherein at least part of the certain individual subpixels remain to create the pattern of the target color image; and
   fixing the pixel layer using flood ultra-violet exposure to modify an entirety of the pixel layer into material with high glass transition temperature.

17. The method as claimed in claim 16, wherein the pixel layer is composed of a material that can be selectively modified by lithography techniques, and a respective glass transition temperature of the modified and unmodified material are sufficiently different.

18. The method as claimed in claim 16, wherein a size of the remaining subpixels is dependent on an amount of the specific optical band or the specific color for the subpixel of the target color image.

19. The method as claimed in claim 1, further comprising depositing at least one functional layer to assist said fabricating.

20. The method as claimed in claim 1, wherein said negating further comprises melting at least one of the microstructures or nanostructures of the pixel layer.

21. The method as claimed in claim 1, wherein said negating further comprises removing at least one of the microstructures or nanostructures of the pixel layer.

22. The method as claimed in claim 1, wherein the color image master stamp further functions as an optically variable device.

23. The method as claimed in claim 22, further comprising forming at least one additional layer of coating on the pixel layer, including at least one of a metal layer or a dielectric layer with high refractive index.

24. The method as claimed in claim 22, wherein a specific optical band or a specific color of at least one of the remaining subpixels displays information invisible to human eyes but readable by a specific reader device.

25. The method as claimed in claim 22, wherein the remaining subpixels of the pixel layer change colors and/or intensity when the incident light and/or viewing angles are varied, the displayed color image shifts color and/or intensity.

26. The method as claimed in claim 22, wherein the remaining subpixels are part of an optical document security device, or publicity device, or product packaging.

* * * * *